(12) United States Patent
Dischiano

(10) Patent No.: US 6,448,801 B2
(45) Date of Patent: Sep. 10, 2002

(54) METHOD AND DEVICE FOR SUPPORTING FLIP CHIP CIRCUITRY IN ANALYSIS

(75) Inventor: John Dischiano, Pfugerville, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/092,674

(22) Filed: Jun. 5, 1998

(51) Int. Cl.[7] .............................................. G01R 31/26
(52) U.S. Cl. ......................................... 324/765; 438/17
(58) Field of Search ................................ 324/755, 765, 324/754, 757, 758; 438/14, 17

(56) References Cited

U.S. PATENT DOCUMENTS

| | | | | |
|---|---|---|---|---|
| 5,408,190 A | * | 4/1995 | Wood et al. | 324/765 |
| 5,532,612 A | * | 7/1996 | Liang | 324/760 |
| 5,815,000 A | * | 9/1998 | Farnworth et al. | 324/755 |

* cited by examiner

*Primary Examiner*—Michael Sherry
*Assistant Examiner*—Russell M. Kobert

(57) ABSTRACT

A method and structure are provided for an effective and efficient method and device for supporting a flip chip die undergoing analysis. The method and device provide added support and rigidity to flip chip dies. The method and device can facilitate multiple rounds of circuit testing and debugging. The result of the method and device is durable casing for flip chip device analysis.

22 Claims, 2 Drawing Sheets

METHOD AND DEVICE FOR SUPPORTING FLIP CHIP CIRCUITRY IN ANALYSIS

RELATED APPLICATIONS

This application is related to the co-filed and commonly assigned applications; U.S. Pat. No. 6,139,403 issued Oct. 31, 2000 entitled "Method and Device for Accessing Flip Chip Circuitry," U.S. Pat. No. 6,239,481 issued Jun. 29, 2001 entitled "Method and Device for Removing a Flip Chip Die from Packaging," U.S. Ser. No. 09/090,447, filed Jun. 4, 1998, now pending, entitled "An Alternate Method and Device for Removing A Flip Chip Die From Packaging," U.S. Ser. No. 09/092,164, filed Jun. 5, 1998, now pending, entitled "A Method and Device for A Flip Chip Die and Package Holder," which are hereby incorporated by reference.

FIELD OF THE INVENTION

The invention relates to semiconductor device assemblies, and more particularly to techniques for analyzing and debugging circuitry associated with a flip chip bonded integrated circuit.

BACKGROUND OF THE INVENTION

The semiconductor industry has seen tremendous advances in technology in recent years which have permitted dramatic increases in circuit density and complexity, and equally dramatic decreases in power consumption and package sizes. Present semiconductor technology now permits single-chip microprocessors with many millions of transistors, operating at speeds of tens (or even hundreds) of MIPS (millions of instructions per second) to be packaged in relatively small, air-cooled semiconductor device packages. A by-product of such high-density and high functionality in semiconductor devices has been the demand for increased numbers of external electrical connections to be present on the exterior of the die and on the exterior of the semiconductor packages which receive the die, for connecting the packaged device to external systems, such as a printed circuit board.

Flip chip technology answers the demand for improved input/output (I/O) connections from the chip to external systems. On a flip chip, the electrical components are located (face down) on the side of the die which attaches to the chip package. In this manner, the flip chip provides a short interconnection length using, for example, ball-grid array (BGA) solder connections. The self-aligning nature of the solder bumps offers the advantages of higher density mounting, improved electrical performance and reliability, and better manufacturability. The positioning of the circuit side is the source of many advantages in the flip chip design. However, in other regards, the orientation of the die with the circuit side face down on a substrate is a disadvantage. For example, access to the circuit region is sometimes necessitated in order to modify or debug a finished chip. Additionally, access to the circuit region is often required through manufacturing stages in order to test and analyze circuit's integrity. In this event, it is necessary to burrow through the body of the flip chip die or through the chip package in order to access the circuit region.

Various methods have been employed to quickly and effectively access the circuit region. A popular method includes milling or grinding off portions of the die, or the chip packaging in order to burrow through to the circuit region. One difficulty with this method is its accuracy. Since the circuit region is formed in a very thin epitaxial layer, with a typical thickness of only 10–20 micrometers ($\mu$m), an overshoot in the milling process can grind through the very circuit for which the testing was intended. Another problem connected to milling the flip chips down is that the process yields a thinner overall structure. The "thinned" die/chip package combination is structurally much weaker. In certain circuit analysis or modification processes, the flip chip die must be removably connected to multiple testing equipment. Typically, the connection between the die and the equipment is made with heat sensitive adhesives. Later, heat is used to loosen and remove the die from the testing equipment. In this process, the "thinned" and structurally fragile die can curl or short circuit, in effect, rendering the silicon die unsuitable for farther analysis or use. For these reasons, it is necessary to have a method and device which will provide added support and rigidity to flip chip dies. An improved method and device should desirably accommodate multiple rounds of circuit testing and debugging.

SUMMARY OF THE INVENTION

The above mentioned problems with integrated circuit technology and other problems are addressed by the present invention and will be understood by reading and studying the following specification. A device and method are described which accord these benefits.

In particular, an illustrative embodiment of the present invention includes a method for accessing a circuit region on a flip chip die. The method includes mounting the flip chip die on a polishing tool. The flip chip die is attached to a chip package. At least two spacers are used to adjust the placement of the flip chip die in the polishing tool. The at least two spacers adjust the placement of the flip chip die to expose portions of the chip package to a polishing blade. The at least two spacers are polished portions taken from the chip package. The circuit of the flip chip die is accessed.

In another embodiment, a device for accessing a circuit region on a flip chip die mounted on a chip package is provided. The device includes a polishing tool. The polishing within the tool is adapted for mounting the flip chip die within the tool. A number of spacers are removably placed within the polishing tool to adjust the mounting of the flip chip die.

In another embodiment, a system for accessing a circuit region on a flip chip die that is mounted circuit side down on a ceramic package is provided. The system includes a device for accessing the circuit region on the flip chip die. The device includes a polishing tool and the polishing tool is adapted for mounting the flip chip die within the polishing tool. A number of spacers are removably placed within the polishing tool to adjust the mounting of the flip chip die. A controller electrically couples to the polishing tool for controlling the operation of the polishing tool.

Thus, a more effective and efficient method and device are provided for adding support and rigidity to flip chip dies. The method and device can facilitate multiple rounds of circuit testing and debugging. The result of the method and device is a durable casing for flip chip device analysis.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

BRIEF DESCRIPTION OF THE DRAWINGS

The following detailed description of the preferred embodiments can best be understood when read in conjunction with the following drawings, in which.

DESCRIPTION OF THE EMBODIMENTS

In the following detailed description of the preferred embodiments, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

The terms "front," "back," "front side," and "back side" as used in this application may be interchanged and are used principally to suggest a structural relationship with respect to one another. The term "horizontal" is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the structure discussed, regardless of the orientation of the structure.

FIGS. 1A–1D describe generally various steps of an embodiment for supporting flip chip circuitry in analysis according to the present invention.

Figure 1A:
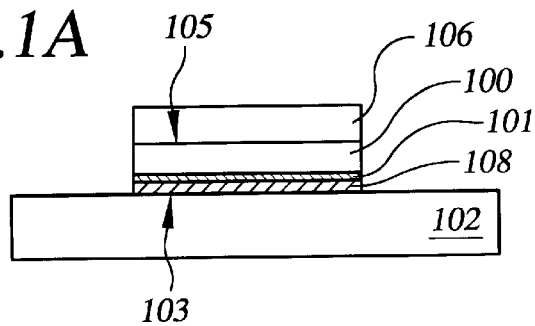
FIGS. 1A–1D show cross-sectional views of successive process steps for supporting flip chip circuitry according to the present invention.

In FIG. 1A, the starting structure is illustrated. The structure includes a flip chip die 100. The flip chip die 100 includes a circuit region 101 located on a front side 103 of the flip chip die 100. The flip chip die 100 further is attached to a chip package 102. The flip chip die 100 is oriented such that the circuit region 101 is adjacent to, or "faces," the chip package 102. In one embodiment, the chip package 102 is formed from ceramic. In another embodiment, the chip package 102 is formed of any suitable material for supporting and protecting the flip chip die 100 as well as facilitating electrical connections to the circuit region 101. In one embodiment the circuit region 101 is electrically connected to the chip package using a ball grid array (BGA) technique, as this method is well practiced in the art. In an alternative embodiment, the circuit region 101 of the flip chip die 100 is electrically connected using any other suitable method. Such alternative methods are well known and practiced by those skilled in the art. An underfill region 108 encases the circuit region 101 and fills the boundary between the circuit region 101 and the chip package 102.

The flip chip die 100 further includes a back side 105. A back plate 106 is attached to the back side 105 of the flip chip die 100. The back plate 106 comprises a silicon carcass salvaged from a discarded silicon die. Such silicon carcasses are remnants of old wafers, and therefore sufficiently available, often even pre-cut to the right size. Attachment of the back plate 106 to the back side 105 of the flip chip die 100 is achieved using any suitable adhesive, as such adhesives are generally used and known to those working in the in the semiconductor device analysis field.

Figure 1B:
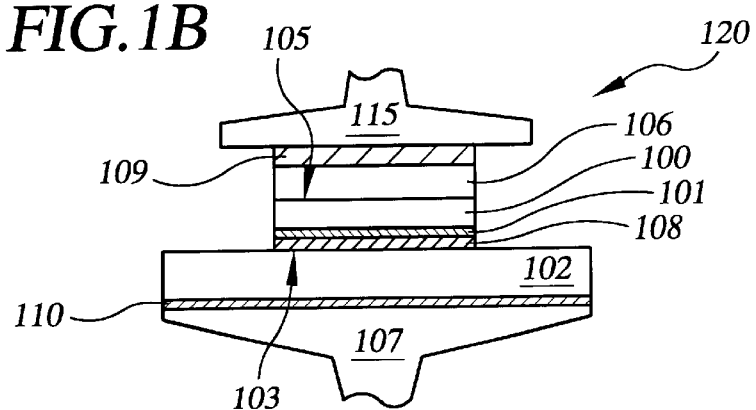

FIG. 1B illustrates the structure following the next sequence of steps. The flip chip die 100 along with the circuit region 101, the attached chip package 102, and the attached back plate 106 are loaded into a first tool 120. The first tool 120 may be any device analysis tool as the same are commonly known and used by those working in the semiconductor device analysis field. In one embodiment, the first tool 120 is a circuit accessing tool adapted for milling off portions of chip packages 102. Circuit accessing tools include polishing tools which are commercially available in the industry. The polishing tool 120 includes a holder 115 and a polishing blade 110 mounted onto a polishing bit 107. The polishing blade 110 opposes the holder 115. The particular placement of the flip chip die 100 in the polishing tool 120 exposes the chip package 102 to the polishing blade 110. The flip chip die 100 is attached to the first tool 120 using an adhesive wax 109 that is removable upon heating. The adhesive chosen to bond the back plate 106 to the back side 105 of the flip chip die 100 is more resistant to heat application than the subsequent adhesive wax 109 selected for attaching the back plate 106 to the first tool 120. Accordingly the back plate 106 does not separate from the back side 105 upon heating the adhesive wax 109.

Figure 1C:
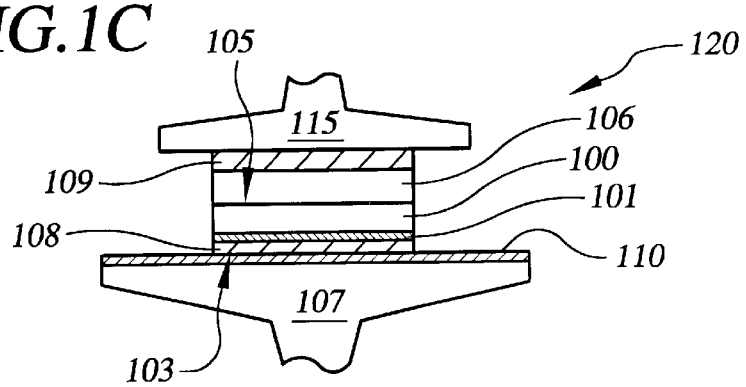

FIG. 1C illustrates the structure following the next series of steps. Once the flip chip die 100 is properly positioned the polishing tool is operated and the chip package 102 is polished through, or "thinned," in order to gain access to the circuit region 101 of the flip the chip die 100. In one embodiment, chip package is removed at different rates. The polishing is performed in multiple steps including a global thinning step and a local thinning step. The global thinning step includes using a first type polishing blade 110. By way of example, a first type polishing blade 110 includes a 45 micrometer ($\mu$m) diamond impregnated metal polishing blade. Such blades are commercially available and generally referenced according to the specifications of the polishing tool 120 selected for use. A local thinning step is next achieved using a second type polishing blade 110. The designation "first" or "second" is not intended to refer to the manufacturing quality of the polishing blade, but rather the abrasiveness grade of the chosen polishing blade 110. By way of example, a second type polishing blade includes a 30 $\mu$m diamond impregnated metal polishing blade.

In one embodiment, rotating the polishing blade 110 involves rotating the polishing blade 110 in one direction and rotating the holder 115 in the opposite direction. Polishing off the chip package 102 includes polishing off the entire chip package to expose an underfill portion 108 of the flip chip die 100. In polishing, or "thinning," the chip package, the polishing blade is rotated between 50 and 120 rpm. The structure is now as is illustrated in FIG. 1C. All of the chip package 102 has been removed to expose the underfill region 108. From this stage forward, the circuit region 101 is readily accessible for analysis. The underfill region 108 is removed using conventional methods, which are well known by those in the art.

Figure 1D:
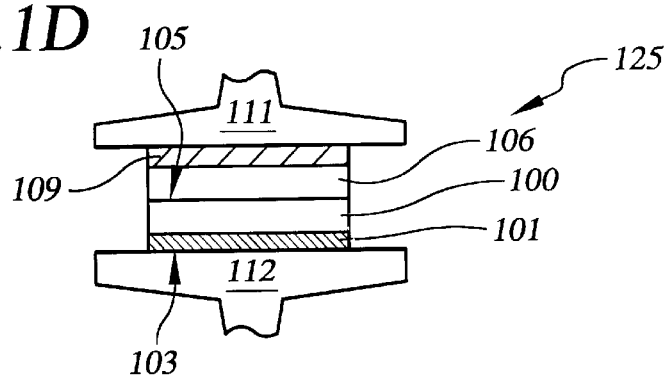

FIG. 1D illustrates the structure following the next sequence of steps according to an embodiment of the present invention. The structure is heated in order to liquefy the adhesive wax 109. The flip chip die 100 along with the circuit region 101, and the attached back plate 106 are unattached from a first tool 120. Next, the flip chip die 100 along with the circuit region 101, and the attached back plate 106 are attached to a second tool 125. The second tool 125 may be any device analysis tool as the same are commonly known and used by those working in the semiconductor device analysis field. As apparent in FIGS. 1C and 1D, the flip chip die 100 and back plate 106 remain generally planarly attached after the adhesive wax 109 has been heated and the die 100 has been removed from the first tool 120. The flip chip, as attached to the back plate, remains generally planar and not curved. In one embodiment, the second tool 125 is a circuit testing tool adapted for modifying or analyzing the circuit components in the circuit region 101. The testing tool 125 includes a holder 111 and a testing portion 112. The testing portion 112 opposes the holder 111. The particular placement of the flip chip die 100 in the testing tool 125 exposes the circuit region 101 to the testing portion 112. The flip chip die 100 is attached by the back plate 106 to the second tool 125 using an adhesive wax 109 that is removable upon heating. The adhesive chosen to bond the back plate 106 to the back side 105 of the flip chip die 100 is more resistant to heat application than the subsequent adhesive wax 109 selected for attaching the back plate 106 to the second tool 125. Accordingly the back plate 106 does not separate from the back side 105 upon heating the adhesive wax 109.

Figure 2:
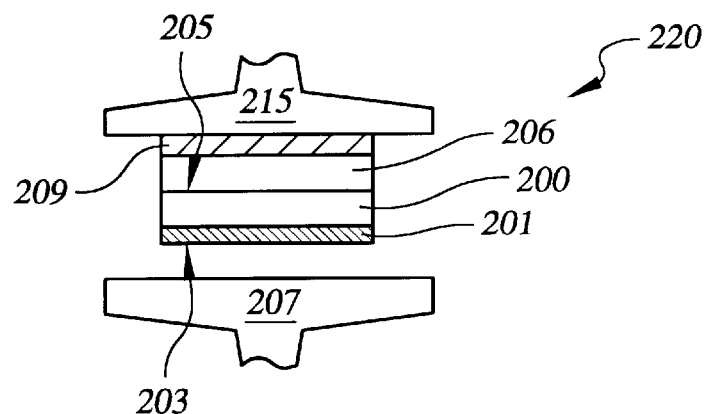
FIG. 2 illustrates a device for accessing flip chip circuitry according to the present invention.

The present invention includes numerous variations to the embodiment described above. FIG. 2 illustrates a device for accessing flip chip circuitry according to the present invention. The device includes a tool 220. The tool 220 includes any suitable tool as used in the semiconductor, or generally in the semiconductor device analysis industry. Such tools 220 are well known by those in the art and are commercially available. The tool 220 includes a holder 215 and a work portion 207, both connected to the tool 220. In one embodiment, the work portion 207 is a polishing blade. In an alternative embodiment, the work portion includes a circuit testing apparatus. A flip chip die 200 is attached to holder 215 of the tool 220. The flip chip die 200 further includes a circuit region 201 located on a front side 203 of the flip chip die 200. The flip chip die 200 further includes a back side 205. The particular placement of the flip chip die 200 in the tool 220 exposes the front side 203 to the work portion 207 of the tool 220. The flip chip die 200 is attached to the tool 220 using an adhesive wax 209 that is removable upon heating. The adhesive chosen to bond the back plate 206 to the back side 205 of the flip chip die 200 is more resistant to heat application than the subsequent adhesive wax 209 selected for attaching the back plate 206 to the tool 220. Accordingly the back plate 206 does not separate from the back side 205 upon heating the adhesive wax 209.

Figure 3:
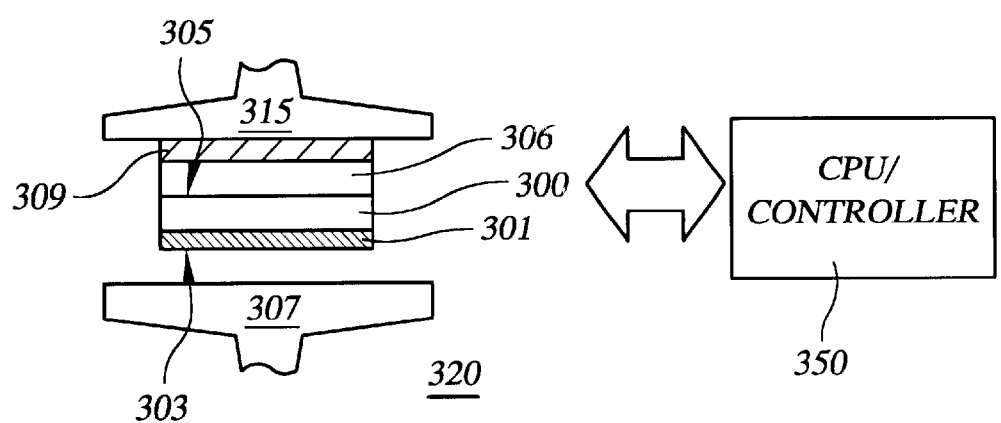
FIG. 3 is a block diagram of a system in accordance with an embodiment of the present invention.

FIG. 3 is a block diagram of a system in accordance with an embodiment of the present invention. FIG. 3 illustrates a controller 350. By way of example, the controller includes an electrical controller. In one embodiment, the controller 350 includes a micro controller as the same are readily accessible for industry needs. In another embodiment, the controller includes a central processing unit (CPU) as part of a computer operated tool configuration. Other types of controllers are well known to those in the art and would be equally suitable for use in the present invention. The controller 350 is electrically coupled to a tool 320. The tool 320 matches the device presented above.

Thus, present invention provides a more effective and efficient method and device for supporting a flip chip die undergoing analysis. The method and device provide added support and rigidity to flip chip dies. The method and device can facilitate multiple rounds of circuit testing and debugging. The result of the method and device is a durable casing for flip chip device analysis.

Although specific embodiments have been illustrated and described herein, it will be appreciated by those of ordinary skill in the art that any arrangement which is calculated to achieve the same purpose may be substituted for the specific embodiments shown.

Therefore, it is manifestly intended that this invention be limited only by the claims and the equivalents thereof.

What is claimed is:

1. A method for accessing a circuit region on a flip chip die, the method comprising:

attaching a silicon wafer remnant from a discarded die to the flip chip die;

attaching the silicon wafer remnant to a holder; and accessing the circuit region of the held flip chip die.

2. The method of claim 1, wherein the step of attaching the silicon wafer remnant to the flip chip die comprises attaching the silicon wafer remnant to a backside of the flip chip die, the circuit region of the flip chip die located on a front side of the flip chip die and attached to a chip package.

3. The method of claim 2, wherein accessing the circuit of the flip chip die comprises thinning the chip package.

4. The method of claim 2, wherein accessing the circuit region of the flip chip die comprises using a polishing tool to thin the chip package.

5. The method of claim 2, wherein the accessing step comprises polishing off the entire chip package in order to expose an underfill portion of the flip chip die.

6. The method of claim 1, wherein attaching the silicon wafer remnant to the holder comprises using an adhesive wax that is removable upon heating.

7. The method of claim 1, the method further comprising removing the flip chip die from the holder and attaching the flip chip die to a second holder.

8. The method of claim 7, wherein removing the flip chip die from the holder comprises heating the flip chip die.

9. The method of claim 1, wherein attaching the flip chip die to the holder comprises using an adhesive wax to attach the silicon wafer remnant to the holder.

10. The method of claim 9, the method further comprising removing the silicon wafer remnant from the holder and attaching the silicon wafer remnant to a second holder.

11. The method of claim 10, wherein removing the silicon wafer remnant from the holder comprises heating the silicon wafer remnant.

12. The method of claim 1, wherein attaching the flip chip die to a holder comprises attaching tie silicon wafer remnant to a circuit accessing tool.

13. The method of claim 1, wherein attaching the flip chip die to a holder comprises attaching the silicon wafer remnant to a circuit testing tool.

14. The method of claim 1, wherein the step of accessing the circuit region of the flip chip die comprises:

a global thinning step; and a local thinning step.

15. The method of claim 14, wherein the global thinning step comprises using a first type polishing blade, and wherein the local thinning step comprises using a second type polishing blade.

16. The method of claim 1, wherein attaching a silicon wafer remnant from a discarded die to the flip chip die includes attaching a non-adhesive silicon wafer remnant to the flip chip die.

17. The method of claim 1, further comprising heating the flip chip die and removing the flip chip die from the holder with the silicon wafer remnant in place, wherein the flip chip die is maintained in a generally planar configuration.

18. A system for accessing a circuit region on a flip chip die, the system comprising:

means for attaching a silicon wafer remnant from a discarded die to the flip chip die;

means for attaching the silicon wafer remnant to a holder; and means for accessing the circuit region of the held flip chip die.

19. A system for accessing a circuit region on a flip chip die, the system comprising:
- a first attachment arrangement adapted to attach a silicon wafer remnant from a discarded die to the flip chip die;
- a second attachment arrangement adapted to attach the silicon wafer remnant to a holder; and
- an accessing arrangement adapted to access the circuit region of the held flip chip die.

20. The system of claim 19, wherein the first and second attachment arrangements include an adhesive.

21. The system of claim 19, wherein the accessing arrangement includes a circuit testing tool adapted to modify circuitry in the flip chip die.

22. A system for accessing a circuit region on a flip chip die, the system comprising:
- a first attachment arrangement adapted to attach a silicon wafer remnant from a discarded die to the flip chip die;
- a second attachment arrangement adapted to attach the silicon wafer remnant to a holder; and
- an accessing arrangement, including a polishing tool, adapted to access the circuit region of the held flip chip die.

* * * * *

UNITED STATES PATENT AND TRADEMARK OFFICE
CERTIFICATE OF CORRECTION

PATENT NO.   : 6,448,801 B2
DATED        : September 10, 2002
INVENTOR(S)  : Dischiano It is certified that error appears in the above-identified patent and that said Letters Patent is hereby corrected as shown below:

<u>Title page,</u>
Item [75], "Pfugerville" should read -- Pflugerville --.

<u>Column 2,</u>
Line 15, "suitable for farther analysis" should read -- suitable for further analysis --.
Line 39, please delete "within the".

<u>Column 4,</u>
Line 29, "embodiment, chip package is removed" should read -- embodiment, the chip package is removed --.

<u>Column 6,</u>
Line 43, "attaching tie silicon" should read -- attaching the silicon --.

Signed and Sealed this

Twenty-fifth Day of February, 2003

JAMES E. ROGAN
*Director of the United States Patent and Trademark Office*